United States Patent
Hooper et al.

(10) Patent No.: US 9,676,611 B2
(45) Date of Patent: Jun. 13, 2017

(54) SENSOR DEVICE PACKAGES AND RELATED FABRICATION METHODS

(71) Applicants: Stephen R. Hooper, Mesa, AZ (US); Philip H. Bowles, Gilbert, AZ (US)

(72) Inventors: Stephen R. Hooper, Mesa, AZ (US); Philip H. Bowles, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 63 days.

(21) Appl. No.: 14/057,262

(22) Filed: Oct. 18, 2013

(65) Prior Publication Data

US 2015/0108653 A1    Apr. 23, 2015

(51) Int. Cl.
*B81B 7/00* (2006.01)
*B81C 1/00* (2006.01)

(52) U.S. Cl.
CPC ............ *B81B 7/007* (2013.01); *B81B 7/0074* (2013.01); *B81C 1/00301* (2013.01); *B81B 2201/0235* (2013.01); *B81B 2201/0242* (2013.01)

(58) Field of Classification Search
CPC ......... B81B 7/00; B81B 7/007; B81B 7/0074; B81C 1/00; B81C 1/00238; B81C 1/00301
USPC ....................................... 361/790
See application file for complete search history.

(56) References Cited

U.S. PATENT DOCUMENTS

| | | |
|---|---|---|
| 6,846,725 B2 | 1/2005 | Nagarajan et al. |
| 8,250,921 B2 | 8/2012 | Nasiri et al. |
| 8,310,050 B2 | 11/2012 | Chen et al. |
| 2004/0090759 A1* | 5/2004 | Kim .............................. 361/790 |
| 2008/0308921 A1* | 12/2008 | Kim ...................... H01L 21/561 257/686 |
| 2010/0028618 A1 | 2/2010 | Gonska et al. |
| 2012/0018868 A1* | 1/2012 | Oganesian .......... H01L 25/0657 257/686 |
| 2012/0212925 A1 | 8/2012 | Zoellin et al. |
| 2013/0078753 A1 | 3/2013 | Hayes et al. |

FOREIGN PATENT DOCUMENTS

CN         101643193 A     2/2010

* cited by examiner

*Primary Examiner* — Fernando L Toledo
*Assistant Examiner* — Lawrence-Linh T Nguyen

(57) ABSTRACT

Sensor device packages and related fabrication methods are provided. An exemplary sensor device package includes a first structure having a sensing arrangement thereon, a second structure having circuitry thereon, and a conductive structure within the first structure and coupled to the circuitry to provide an electrical connection to the circuitry through the first structure. Thus, circuitry on the second structure may be electrically connected to an interface of the sensor device package through the first structure.

18 Claims, 5 Drawing Sheets

SENSOR DEVICE PACKAGES AND RELATED FABRICATION METHODS

TECHNICAL FIELD

Embodiments of the subject matter described herein relate generally to electronic device packaging, and more particularly, to sensor device packages and related fabrication methods.

BACKGROUND

Microelectromechanical systems (MEMS) are widely used in a variety of sensing applications. In some applications, the use of multiple different MEMS sensors to measure different properties may be desirable. For example, an electronic device (e.g., a smartphone, a cellular phone, or the like) may include a MEMS gyroscope that generates electrical signals indicative of the orientation of the device and/or a MEMS accelerometer that generates electrical signals indicative of the rate and/or direction of acceleration of the device. To facilitate modern electronic devices that continually decrease in size and/or form factor while increasing in complexity, it is desirable to provide sensor devices that are smaller and/or packaged more densely without compromising performance of the sensor devices.

BRIEF DESCRIPTION OF THE DRAWINGS

The various embodiments will hereinafter be described in conjunction with the following drawing figures, which are not necessarily drawn to scale, wherein like numerals denote like elements, and wherein.

DETAILED DESCRIPTION

The following detailed description is merely illustrative in nature and is not intended to limit the embodiments of the subject matter or the application and uses of such embodiments. Any implementation described herein as exemplary is not necessarily to be construed as preferred or advantageous over other implementations. Additionally, there is no intention to be bound by any expressed or implied theory presented in the preceding technical field, background, or the following detailed description.

Embodiments of the subject matter described herein relate to stacked multi-sensor semiconductor device packages that include conductive interconnect structures within and extending through one or more semiconductor substrates (or dies) having one or more sensing arrangements fabricated thereon. For purposes of explanation, the conductive interconnect structures may alternatively be referred to herein as through-vias (or vias). The through-vias provide electrical connections between sensing arrangement(s) and control circuitry fabricated on the semiconductor substrates along with electrical connections between the control circuitry and interfaces of the device packages vertically through one or more of the semiconductor substrates having a sensing arrangement fabricated thereon. In this regard, the semiconductor substrate having the control circuitry fabricated thereon (alternatively referred to herein as an ASIC die) may have a footprint that is less than or equal to the footprint of one or more of the sensor semiconductor substrates (alternatively referred to herein as sensor dies) and may be stacked on top of those sensor dies to avoid increasing the footprint when the ASIC die is integrated with the sensor dies in the sensor device package. It should be appreciated that the subject matter described herein is not limited to any particular number or type of sensing arrangements incorporated within the sensor device package, and practical embodiments of a stacked multi-sensor semiconductor device package may include any number of sensor dies configured to measure, sense, or otherwise quantify any number of characteristics.

Figure 1:
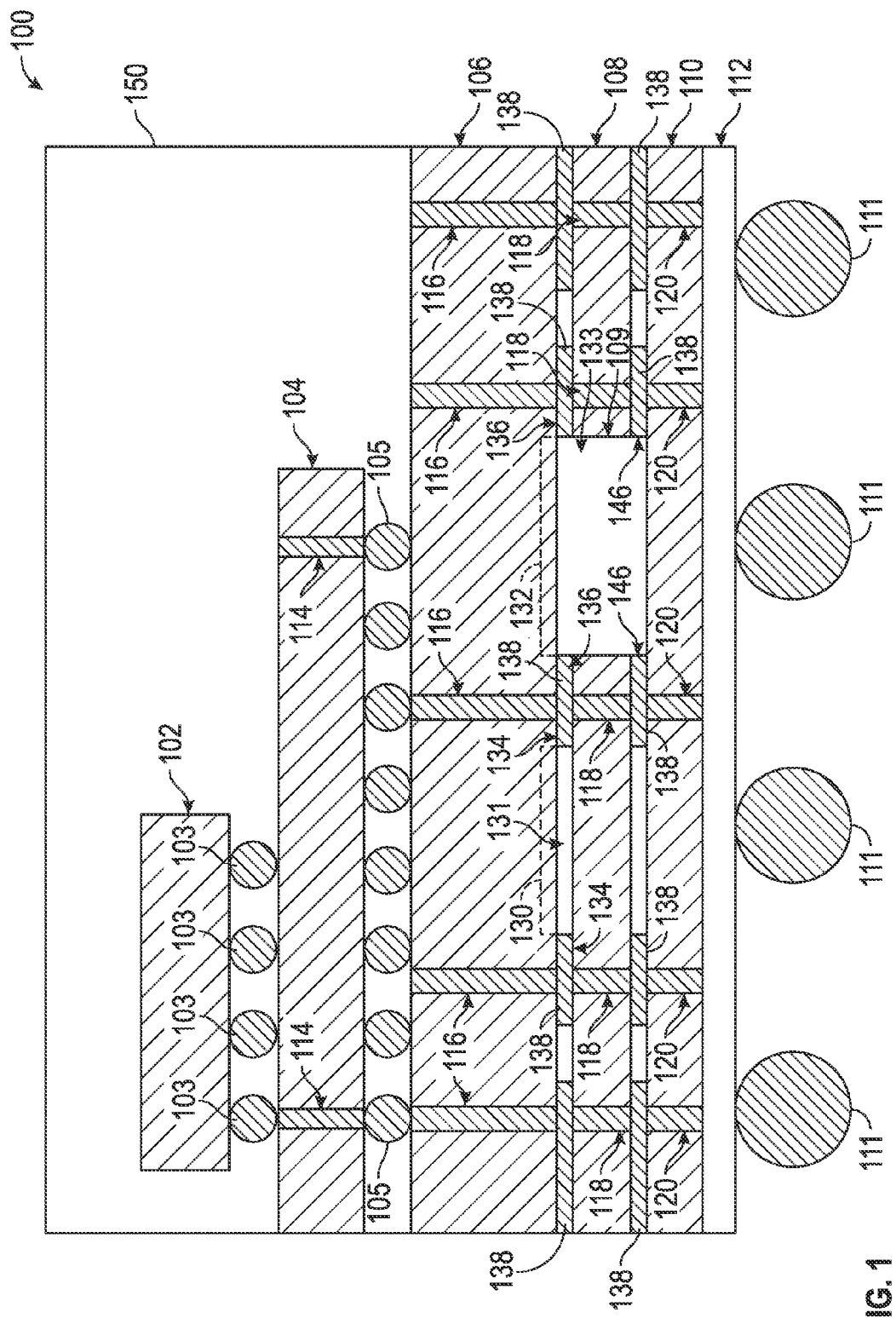
FIG. 1 depicts a cross-sectional view of an exemplary sensor semiconductor device package in accordance with one or more embodiments of the invention.

FIG. 1 depicts one exemplary embodiment of a stacked multi-sensor semiconductor device package 100. The stacked sensor device 100 includes, without limitation, a first sensor structure 102, a second structure 104, a second sensor structure 106, one or more capping structures 108, 110, and a support structure 112. The first sensor structure 102 is mounted or otherwise coupled to a first side of the second structure 104, the opposing side of the second structure 104 is mounted or otherwise coupled to a first side of the second sensor structure 106, and the one or more capping structures 108, 110 are mounted or otherwise coupled to the second side of the second sensor structure 106 to establish one or more sealed chambers 131, 132 on the second side of the second sensor structure 106, as described in greater detail below. In exemplary embodiments, the structure 104 is realized as a portion of a semiconductor substrate (or die) having an application specific integrated circuit (ASIC) or other control circuitry formed thereon that is coupled to one or more of the sensing arrangements on one or more of the sensor structures 102, 106. For purposes of explanation, but without limitation, the second structure 104 may alternatively be referred to herein as an integrated circuit die or ASIC die.

The stacked sensor device 100 includes one or more input and/or output (I/O) interfaces 111, and the support structure 112 provides electrical connections to/from the package I/O interfaces 111 on the lower side of the support structure 112 from/to the upper side of the support structure 112. The stacked structures 102, 104, 106, 108, 110 are coupled to the upper side of the support structure 112, and the structures 106, 108, 110 disposed between the ASIC die 104 and the package interfaces 111 include conductive interconnect structures 116, 118, 120 that provide electrical connections between the circuitry on the ASIC die 104 and the package interfaces 111 vertically through the respective structures 106, 108, 110. As a result, the ASIC die 104 may be stacked or otherwise mounted on the structures 106, 108, 110 with the first sensor structure 102 being stacked or otherwise mounted on the ASIC die 104 to provide the sensor device package 100 that includes multiple sensor structures and/or sensing arrangements and an ASIC without increasing the footprint of the device package 100. Additionally, the ASIC die 104 also include conductive interconnect structures 114 that provide electrical connections vertically through ASIC die 104 to control circuitry fabricated on the upper surface of the ASIC die 104 and/or to the sensing arrangement on the sensor die 102 overlying the ASIC die 104.

In exemplary embodiments, the conductive interconnect structures 114, 116, 118, 120 are realized as one or more a conductive materials that are deposited or otherwise formed within voids etched into a respective structure 104, 106, 108, 110. In this regard, to fabricate the conductive interconnect structures 114, 116, 118, 120, the respective structure 104, 106, 108, 110 may be masked with a masking material patterned to expose portions of the respective structure 104, 106, 108, 110 that are etched to a depth that exceeds the thickness of the respective structure 104, 106, 108, 110, thereby forming voids that extend entirely through the respective structure 104, 106, 108, 110. Thereafter, one or more conductive materials may be deposited or otherwise formed in the voids, resulting in the conductive interconnect structures 114, 116, 118, 120 within the structures 104, 106, 108, 110. For purposes of explanation, the conductive interconnect structures 114, 116, 118, 120 may alternatively be referred to herein as through-vias (or vias). In this regard, when a respective structure 104, 106, 108, 110, 112 having vias 114, 116, 118, 120 provided therein is realized as a substrate (or die) of silicon (or another semiconductor material), the vias 114, 116, 118, 120 may alternatively be referred to as through-silicon vias (TSVs) in that the vias 114, 116, 118, 120 pass entirely through the silicon and are exposed on opposing sides of the silicon.

Still referring to FIG. 1, the first sensor structure 102 generally represents a semiconductor substrate (or die) having a footprint or lateral area that is less than the underlying structures 104, 106, 108, 110 in the device package 100. The first sensor structure 102 includes at least one sensing arrangement fabricated or otherwise provided thereon that is configured to generate or otherwise output one or more electrical signals indicative of a characteristic that is sensed, measured, or otherwise quantified by the sensing arrangement. For example, in accordance with one or more embodiments, the first sensor structure 102 includes a magnetic sensing arrangement (or magnetometer) configured to output electrical signals indicative of the relative strength and direction of a sensed magnetic field proximate to or otherwise in the vicinity of the device package 100. For purposes of explanation, but without limitation, the first sensor structure 102 may alternatively be referred to herein as a magnetometer die. In the illustrated embodiment, the magnetometer die 102 is realized as a flip chip that includes a plurality of conductive bonding structures 103 that are formed or otherwise provided on a lower surface of the magnetometer die 102 to provide appropriate I/O interfaces for the magnetometer die 102 to conduct or otherwise transmit electrical signals from/to the magnetic sensing arrangement. For example, the conductive bonding structures 103 may be realized as solder balls (or solder bumps) that facilitate soldering, bonding, or otherwise mounting the magnetometer die 102 to the ASIC die 104. Although not illustrated in FIG. 1, in alternative embodiments, the magnetic sensing arrangement may be fabricated on or in the upper surface of the magnetometer die 102, with conductive interconnect structures (or through-vias) being formed within the magnetometer die 102 to provide electrical connections between the magnetic sensing arrangement and the conductive bonding structures 103.

In exemplary embodiments, the upper surface of the ASIC die 104 includes bonding pads or other interfaces for mounting, bonding, adhering, or otherwise joining the ASIC die 104 to the conductive bonding structures 103 on the magnetometer die 102. The upper surface of the ASIC die 104 may also include one or more conductive traces or metallization layers that are appropriately patterned to route or otherwise transmit electrical signals from/to the conductive bonding structures 103 to/from the control circuitry on the ASIC die 104. In this manner, output electrical signals indicative of the strength and direction of the magnetic field sensed by the magnetic sensing arrangement on the magnetometer die 102 may be received by the control circuitry on the ASIC die 104 and utilized by the control circuitry to determine a metric indicative of the sensed magnetic field based on those electrical signals. In some embodiments, the routing on the upper surface may transmit electrical signals from/to the conductive bonding structures 103 to/from one or more conductive interconnect structures 114 within the ASIC die 104 to provide an electrical connection vertically through the ASIC die 104 to one or more of the package interfaces 111 and/or other external electrical components or systems. Additionally, if the control circuitry is on the lower surface of the ASIC die 104, one or more of the conductive interconnect structures 114 may be utilized to provide an electrical connection vertically through the ASIC die 104 between the magnetic sensing arrangement and the control circuitry.

In the embodiment of FIG. 1, the sensor structure 106 is realized as a substrate (or die) of semiconductor material that is exposed to one or more semiconductor fabrication process steps to define a plurality of microelectromechanical system (MEMS) sensing arrangements in respective regions 130, 132 of the substrate 106. For example, a MEMS acceleration sensing arrangement (or accelerometer) may be fabricated on a first region 130 of the substrate 106 and configured to generate or otherwise output one or more electrical signals indicative of indicative of the strength and direction of an acceleration of the device package 100 that is sensed, measured, or otherwise quantified by the acceleration sensing arrangement, and a MEMS orientation sensing arrangement (or gyroscope) may be fabricated on a second region 132 of the substrate 106 and configured to generate or otherwise output one or more electrical signals indicative of the relative orientation of the device package 100 that is sensed, measured, or otherwise quantified by the orientation sensing arrangement. For purposes of explanation, but without limitation, the structure 106 may alternatively be referred to herein as the MEMS die.

The illustrated ASIC die 104 includes a plurality of conductive bonding structures 105 (e.g., solder balls or the like) that are formed or otherwise provided on the lower surface of the ASIC die 104 to provide appropriate I/O interfaces for the ASIC die 104. In this regard, the lower surface of the ASIC die 104 may include one or more conductive traces or metallization layers that are appropriately patterned to route or otherwise transmit electrical signals from/to the vias 114 to the conductive bonding structures 105. Similarly, the upper surface of the MEMS die 106 includes bonding pads or other interfaces corresponding to the conductive bonding structures 105 for mounting, bonding, adhering, or otherwise joining the ASIC die 104 to the MEMS die 106. The upper surface of the MEMS die 106 may also include one or more conductive traces or metallization layers that are appropriately patterned to route or otherwise transmit electrical signals from/to one or more of the conductive bonding structures 105 to/from one or more of the vias 116 in the MEMS die 106. Additionally, in some embodiments, the upper surface of the MEMS die 106 is also configured to route or otherwise transmit electrical signals from/to the sensing arrangements on the respective regions 130, 132 of the MEMS die 106 to/from one or more of the conductive bonding structures 105. In alternative embodiments, the lower surface of the MEMS die 106 may be configured to route or otherwise transmit electrical signals from/to the sensing arrangements to/from one or more of the vias 116. In this manner, output electrical signals indicative of the strength and direction of the acceleration detected by the MEMS accelerometer on the first region 130 of the MEMS die 106 may be received by the control circuitry on the ASIC die 104 and utilized by the control circuitry to determine a metric indicative of the sensed acceleration based on those electrical signals. Similarly, output electrical signals indicative of the current orientation of the device package 100 detected by the MEMS gyroscope on the second region 132 of the MEMS die 106 may be received by the control circuitry on the ASIC die 104 and utilized by the control circuitry to determine a metric indicative of the sensed orientation.

Still referring to FIG. 1, in accordance with one or more embodiments, the sensing regions 130, 132 on the MEMS die 106 may be fabricated or otherwise formed such that hermetically-sealed chambers 131, 133 are established on the lower side of the sensing regions 130, 132 to establish fixed reference pressures for the respective sensing arrangements when the MEMS die 106 is bonded, mounted, joined, or otherwise coupled to the capping structures 108, 110. In one or more embodiments, the capping structures 108, 110 are realized as dummy semiconductor substrates (or dies) that do not include functional circuitry, sensing arrangements, or other electrical components fabricated thereon and merely include through vias 118, 120 and/or other interconnects (e.g., conductive traces or other lateral interconnects on the upper and/or lower surfaces) for supporting transmission of electrical signals between the overlying dies 102, 104, 106 and the package interfaces 111.

To establish the chambers 131, 133, sealing structures 134, 136, 146 realized as a ring or another continuous body of a nonporous conductive bonding material 138 are vertically aligned with sensing regions 130, 132 so that the sealing structures 134, 136, 146 circumscribe or otherwise surround the periphery of the respective sensing regions 130, 132 to create airtight sealed chambers 131, 133 between the dies 106, 108. For example, the sealing structures 134, 136, 146 may be realized using a conductive material 138 (e.g., aluminum germanium or the like) capable of eutectically bonding or otherwise affixing to both the lower surface of the MEMS die 106 to the upper surface of the first capping die 108 to provide the airtight seal for a first chamber 131. Additionally, the conductive material 138 may be aligned with through-vias 116, 118, 120 and/or the periphery of the dies 106, 108, 110 to provide electrical connections between through-vias 116, 118, 120 and/or bond the peripheries of the dies 106, 108, 110 together. The sensor die 106 and the first capping die 108 are bonded, affixed, or otherwise joined at a desired reference pressure for the sensing arrangement on the first sensing region 130. For example, when the first region 130 includes a MEMS accelerometer, the dies 106, 108 may be bonded at a bonding temperature in the range of about 420° C. to about 520° C. in a chamber having a pressure in the range of about 2 atmospheres (atm) to about 3 atm such that the fixed reference pressure for the first chamber 131 is substantially equal to about 1 atm at room temperatures. The first capping die 108 includes an opening 109 aligned with the second sensing region 132 to allow the second chamber 133 to have a different fixed reference pressure than the first chamber 131. In a similar manner, the second capping die 110 is eutectically bonded, affixed, or otherwise joined to the previously-bonded dies 106, 108 at a desired reference pressure for the sensing arrangement on the second sensing region 132. For example, when the second region 130 includes a MEMS gyroscope, the dies 108, 110 may be bonded at an elevated bonding temperature in a chamber having a pressure that results in the fixed reference pressure of less than about 3 Torr, and more preferably less than about 0.2 Torr, for the second chamber 132 at ambient and/or room temperatures.

In exemplary embodiments, the support structure 112 is realized as one or more redistribution layers configured to transmit, route, or otherwise connect the package I/O interfaces 111 to the vias 120 within the lower capping die 110. For example, one or more redistribution metallization layers may be formed or otherwise provided on the lower surface of the lower capping die 110, for example, by alternately forming or otherwise depositing layers of dielectric and metal materials, providing vias within the dielectric layers to provide vertical electrical connections through the support structure 112, and patterning the metal layers to provide the desired lateral electrical interconnections among the vias 120 and/or the package interfaces 111. In the illustrated embodiment, the package interfaces 111 are realized as conductive bonding structures, such as solder balls (or solder bumps), that are formed on exposed portions of the lower redistribution metal layer to facilitate soldering, bonding, or otherwise mounting the device package 100 to a printed circuit board (PCB) or another electronics substrate, which, in turn, is appropriately patterned to conduct or otherwise transmit electrical signals to/from the I/O interfaces 111 of the semiconductor device package 100 to external electrical components and/or systems. It will be appreciated that any number of redistribution metallization layers can be utilized in a practical embodiment of the device package 100 with any number of routing and/or layout topologies, and accordingly, for clarity and ease of illustration, the details of the support structure 112 are not depicted in FIG. 1. Additionally, in alternative embodiments, the support structure 112 may be realized as a passivation layer (e.g., a thin layer of organic material with copper and/or other metal routing therein) in lieu of redistribution metallization layers.

Still referring to FIG. 1, by vertically stacking the structures 102, 104, 106, 108, 110, an integrated multi-sensor device package 100 may be achieved with a reduced footprint that is only constrained by the ASIC die 104 and/or the sensor die 102, 106 having the largest footprint. For example, in the embodiment of FIG. 1, the multi-sensor device package 100 may accommodate a magnetometer die 102 that is capable of providing 3-axis magnetic field measurements along with a MEMS die 106 that is capable of providing both 3-axis acceleration measurements and 3-axis orientation measurements, resulting in a so-called nine degrees of freedom (or 9 DoF) package. Furthermore, additional sensor dies may be stacked in a practical embodiment of the multi-sensor device package 100 to provide additional degrees of freedom without increasing the footprint of the device package 100. For example, MEMS sensor dies including pressure sensing arrangements and/or temperature sensing arrangements may be added to the stacked structures 102, 104, 106, 108, 110 with corresponding vertical vias provided within those sensor dies to vertically transmit the electrical output signals generated by the respective sensing arrangements to the control circuitry on the ASIC die 104 and/or the package interfaces 111.

By virtue of the vias 114, 116, 118, 120 within the structures 104, 106, 108, 110, the electrical output signals generated by the sensing arrangements on the sensing regions 130, 132 of the MEMS sensor die 106 are provided to the control circuitry on the ASIC die 104, which, in turn, calculates or otherwise determines metrics that quantify or otherwise correspond to the relative strengths and/or directions of the characteristics sensed or otherwise measured by the sensing arrangements on the sensor dies 102, 106. In this regard, the control circuitry on the ASIC die 104 may be configured to determine a measured magnetic field strength and direction based on the 3-axis electrical output signals provided by the magnetometer on the magnetometer die 102, a measured magnetic acceleration and direction of acceleration based on the 3-axis electrical output signals provided by the accelerometer on the MEMS sensor die 106, and a measured device orientation based on the 3-axis electrical output signals provided by the gyroscope on the MEMS sensor die 106. Thereafter, the vertical electrical connections provided by the vias 114, 116, 118, 120 in the ASIC die 104 and the underlying structures 106, 108, 110, 112 along with the lateral interconnections provided by the ASIC die 104 and the underlying structures 106, 108, 110, 112 facilitate the measured values determined by the control circuitry on the ASIC die 104 being transmitted or otherwise provided from the ASIC die 104 to external electrical components and/or systems coupled to the package I/O interfaces 111.

It should be noted that one or more of the vias 116 within the MEMS sensor die 106 are utilized to provide electrical output signals from the sensing arrangements on the sensing regions 130, 132 to the control circuitry on the ASIC die 104, while other vias 116 within the MEMS sensor die 106 are utilized to provide the electrical signals indicative of the measured values determined by the control circuitry to the package interfaces 111 via the vias 118, 120 and support structure 112. Similarly, when the control circuitry is on the upper surface of the ASIC die 104, one or more of the vias 114 within the ASIC die 104 may be utilized to provide electrical output signals from the sensing arrangements on the sensing regions 130, 132 to the control circuitry on the ASIC die 104, while other vias 114 within the ASIC die 104 may be utilized to provide the electrical signals indicative of the measured values determined by the control circuitry to the package interfaces 111 via the vias 116, 118, 120 and support structure 112.

To fabricate the device package 100 of FIG. 1, a first wafer of semiconductor material is exposed to a number of semiconductor fabrication processes to form or otherwise fabricate the sensing arrangements on the sensing regions 130, 132 along with the vias 116 within the wafer, resulting in multiple instances of the MEMS sensor die 106 throughout the wafer. In this regard, portions of the MEMS sensor wafer are etched to a depth that meets or exceeds the final thickness of the MEMS sensor wafer and filled with one or more conductive materials to form through-vias 116 within the MEMS sensor wafer. When the ASIC die 104 includes bonding structure 105, one or more fabrication processes are performed to provide bonding locations for the ASIC die 104 on one side of the MEMS sensor wafer (along with corresponding lateral interconnections between the bonding locations and the vias 116). Additionally, a bondable layer of conductive material (e.g., copper, gold, or the like) for bonding with the bonding material 138 is formed on the opposing side of the MEMS sensor wafer and patterned to correspond to the sealing structures 134, 136 and/or the vias 116. Another wafer of semiconductor material is exposed to semiconductor fabrication processes to form or otherwise fabricate multiple instances of the upper capping die 108 that include openings 109 aligned with the second sensing regions 132 on the MEMS sensor wafer, vias 118 within the wafer, and bondable layers on both sides of the wafer for bonding with the bonding material 138. In this regard, the bondable layer on the upper side of the first capping wafer is patterned to correspond to the sealing structures 134, 136 circumscribing both sensing regions 130, 132 and/or the vias 116, while the bondable layer on the lower side of the first capping wafer is patterned to correspond to the sealing structure 146 circumscribing the second sensing region 132 and/or the vias 118. Another wafer of semiconductor material is exposed to semiconductor fabrication processes to form or otherwise fabricate multiple instances of the lower capping die 110 that include the vias 120 within the wafer along with a bondable layer on one side of the wafer for bonding to the upper capping wafer. In this regard, the bondable layer on the upper side of the second capping wafer is patterned to correspond to the sealing structure 146 and/or the vias 118. The MEMS sensor wafer and the upper capping wafer are bonded (e.g., via eutectic bonding, thermal compression, or the like) together in a chamber having a particular pressure at the particular bonding temperature that results in the chamber 131 having the desired reference pressure for the sensing arrangement on the first sensing region 130 (e.g., about 1 atm) at ambient and/or room temperatures. Thereafter, the upper capping wafer and the lower capping wafer are bonded together in a chamber having a particular pressure at the particular bonding temperature that results in the chamber 133 having the desired reference pressure for the sensing arrangement on the second sensing region 132 (e.g., less than 0.2 Torr) at ambient and/or room temperatures.

Still referring to FIG. 1, another wafer of semiconductor material is exposed to semiconductor fabrication processes to form or otherwise fabricate control circuitry, the vias 114, the conductive bonding structures 105 on one side of the wafer, and the bonding locations and/or lateral interconnections for the conductive bonding structures 103 on the opposing side of the wafer, resulting in multiple instances of the ASIC die 104 throughout the wafer. Yet another wafer of semiconductor material is exposed to semiconductor fabrication processes to form or otherwise fabricate the magnetic sensing arrangement and the conductive bonding structures 103 on one side of the wafer, before dicing the wafer to obtain multiple instances of the magnetometer die 102. The instances of the magnetometer die 102 are distributed and bonded or otherwise mounted to the bonding locations on the instances of the ASIC die 104 on the ASIC wafer, for example, by performing a reflow soldering process. The ASIC wafer is diced to obtain multiple instances of the stacked dies 102, 104, which are distributed and bonded or otherwise mounted to the bonding locations on the upper surface of the instances of the MEMS sensor dies 106 on the MEMS sensor wafer, for example, by performing another reflow soldering process. Thereafter, the fabrication process may continue by applying or otherwise forming a molding compound 150 overlying the stacked structures 102, 104, 106, 108, 110. Depending on the embodiment, the redistribution support structure 112 and the package interfaces 111 may be fabricated on the lower surface of the lower capping wafer after bonding the structures 106, 108, 110 and either before or after mounting the structures 102, 104 to the MEMS sensor wafer. After the molding compound 150, the support structure 112, and the package interfaces 111 are formed, the MEMS sensor wafer and the capping wafers are diced or otherwise singulated to provide multiple instances of the multi-sensor device package 100. After singulation, the molding compound 150 overlies the stacked dies 102, 104, 106, 108, 110 and laterally surrounds or otherwise encapsulates the dies 102, 104 having footprints that are less than the footprint of the device package 110.

Figure 2:
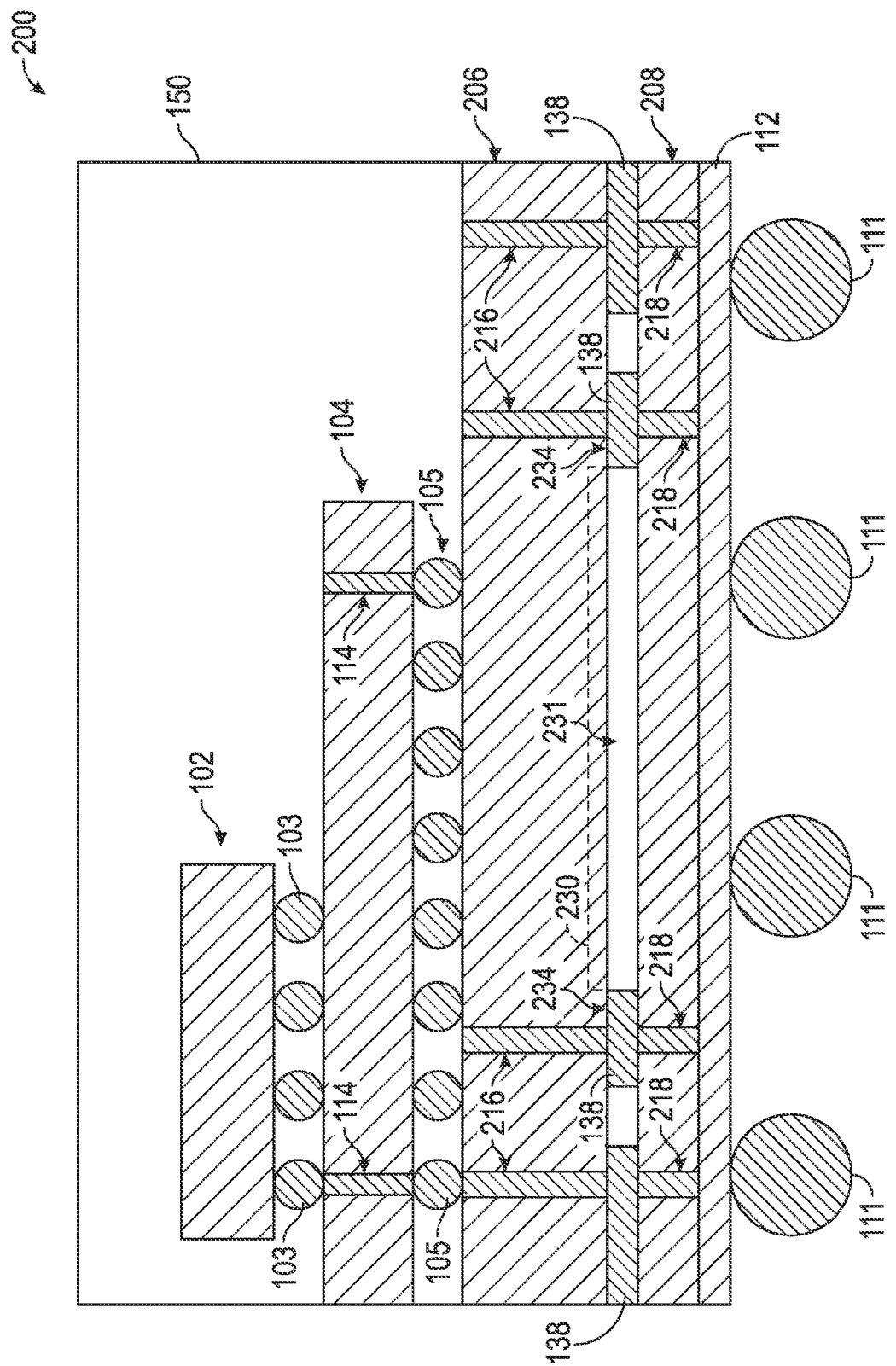
FIGS. 2-4 depict cross-sectional views of sensor semiconductor device packages in accordance with various alternative embodiments of the invention.

FIG. 2 depicts an alternative embodiment of a stacked multi-sensor semiconductor device package 200. Various elements in the stacked multi-sensor semiconductor device package 200 are similar to those described above in the context of the stacked multi-sensor semiconductor device package 100 of FIG. 1, and such common aspects will not be redundantly described in the context of FIG. 2. In the embodiment of FIG. 2, the stacked multi-sensor semiconductor device package 200 includes a single capping structure 208 to provide a single sealed chamber 231 for a sensing arrangement on a MEMS sensor die 206. In this regard, the MEMS sensor die 206 may include a single sensing region 230 that is sealed or otherwise maintained at the reference pressure established by the chamber 231 by virtue of a sealing structure 234 of a bonding material 138 that circumscribes the sensing region 230. Accordingly, any sensing arrangements formed on the sensing region 230 operate at the fixed reference pressure defined by the chamber 231. In a similar manner as described above, the MEMS sensor die 206 and the capping die 208 each include conductive vias 216, 218 that provide electrical connections to/from the control circuitry on the ASIC device 104 vertically through the respective dies 206, 208. One benefit of the stacked multi-sensor semiconductor device package 200 is that for applications that require only a single MEMS sensing arrangement on the MEMS sensor die 206 or a single reference pressure for all of the MEMS sensing arrangements on the MEMS sensor die 206, the footprint of the MEMS sensor die 206 may be reduced relative to the MEMS sensor die 106 in the device package 100 of FIG. 1, thereby achieving a multi-sensor device package 200 with reduced footprint.

Figure 3:
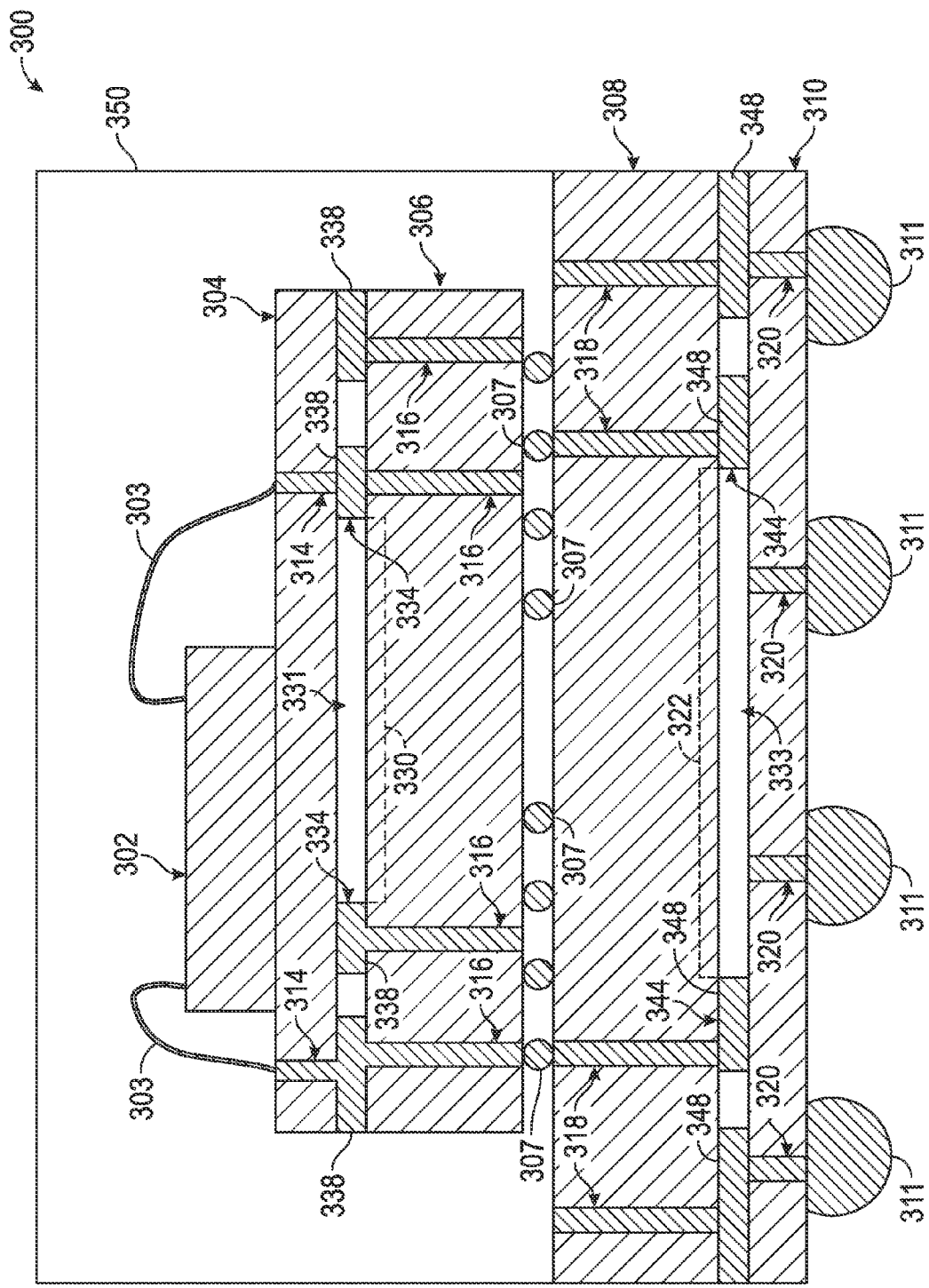

FIG. 3 depicts an exemplary embodiment of a stacked multi-sensor semiconductor device package 300 that includes multiple MEMS sensor dies 306, 308. Various elements in the stacked multi-sensor semiconductor device package 300 are similar to those described above in the context of the stacked multi-sensor semiconductor device package 100 of FIG. 1 and will not be redundantly described in the context of FIG. 3. In the embodiment of FIG. 3, an ASIC die 304 is bonded, affixed, or otherwise joined to the upper MEMS sensor die 306 to establish a sealed chamber 331 having a fixed reference pressure for a sensing arrangement on a sensing region 330 of the MEMS sensor die 306, while a capping die 310 is bonded, affixed, or otherwise joined to the lower MEMS sensor die 308 to establish another sealed chamber 333 having a fixed reference pressure for a sensing arrangement on a sensing region 332 of the MEMS sensor die 308. Additionally, another sensor die 302 may be bonded, mounted, or otherwise joined to the ASIC die 304 to provide additional sensing capabilities within the multi-sensor device 300. For purposes of explanation, but without limitation, the upper MEMS sensor die 306 may be described as being an accelerometer die, the lower MEMS sensor die 308 may be described as being a gyroscope die, and the upper sensor die 302 may be described as being a magnetometer die. In the embodiment of FIG. 3, the I/O interfaces 311 for the device package 300 are provided or otherwise formed directly on the lower surface of the capping die 310, however, in alternative embodiments, a support structure or one or more redistribution layers may be provided on the lower surface of the capping die 310 to provide electrical connections to the I/O interfaces 311 in a similar manner as described above in the context of FIG. 1.

Still referring to FIG. 3, in the illustrated embodiment, rather than being realized as a flip chip device capable of being soldered on the ASIC die 304 as depicted in FIG. 1, the magnetometer die 302 includes bonding pads on its upper surface for providing wire bonds 303 between those bonding pads and corresponding bonding pads on the upper surface of the ASIC die 304. In this regard, the magnetic sensing arrangement for the magnetometer die 302 may be formed in or on its upper surface, with corresponding routing or interconnects between the bonding pads for the wire bonds 303 and the magnetic sensing arrangement, thereby providing an electrical connection between the magnetic sensing arrangement and the control circuitry on the ASIC die 304 via the wire bonds 303. The upper surface of the ASIC die 304 may also include routing from the bonding pads for the wire bonds 303 to vias 314 within the ASIC die 304 to transmit electrical signals from/to the magnetometer die 302 to/from control circuitry formed on or in the lower surface of the ASIC die 304. It should be noted that in alternative embodiments, the magnetometer die 302 may be realized as a flip chip that is soldered or otherwise bonded to the ASIC die 304 in a manner that provides electrical connections to/from the magnetometer die 302 in lieu of the wire bonds 303, in which case the wire bonds 303 need not be present.

To establish the chamber 331 for the acceleration sensing arrangement fabricated on or in the sensing region 330, a sealing structure 334 of a conductive bonding material 338 is provided between the ASIC die 304 and the accelerometer die 306, and the sealing structure 334 is vertically aligned with sensing region 330 so that the sealing structure 334 circumscribes or otherwise surrounds the periphery of the sensing region 330. Corresponding bonding locations are provided on the lower surface of the ASIC die 304 and the upper surface of the accelerometer die 306 in alignment with the sealing structure 334, and the dies 304, 306 are bonded using the sealing material 338 to provide the sealed chamber 331 having the desired pressure. Additional portions of the conductive bonding material 338 may be provided outside of the sealing structure 334 to bond or otherwise join outer portions of the dies 304, 306 together and provide the desired electrical interconnections between the dies 304, 306. In a similar manner, to establish the chamber 333 for the gyroscopic sensing arrangement fabricated on or in the sensing region 332, another sealing structure 344 of a conductive bonding material 348 is provided between the gyroscope die 308 and the capping die 310 and is vertically aligned with sensing region 332 to circumscribe the sensing region 332. Thereafter, the dies 308, 310 are bonded together to provide the sealed chamber 333 having the desired pressure for the sensing region 332 while also providing the desired electrical interconnections between the dies 308, 310.

In a similar manner as described above, the MEMS sensor dies 306, 308 and the capping die 310 include vias 316, 318, 320 that extend through the dies 306, 308, 310, thereby providing vertical electrical connections to/from the package interfaces 311 from/to the control circuitry on the ASIC die 304 vertically through the dies 306, 308, 310. In the illustrated embodiment, the accelerometer die 306 is realized as a flip chip having conductive bonding structures 307 on its lower surface for bonding or otherwise mounting the accelerometer die 306 to the upper surface of the gyroscope die 308 in a manner that provides electrical connections to/from the upper surface of the gyroscope die 308. In this regard, the upper surface of the gyroscope die 308 includes lateral interconnections or routing for transmitting output electrical signals from the gyroscope on the sensing region 332 from one or more of the vias 318 within the gyroscope die 308 to one or more of the connection structures 307. The lower surface of the accelerometer die 306 includes lateral interconnections or routing for transmitting the gyroscope output signals from the connection structure(s) 307 to one or more vias 316 for transmission vertically through the accelerometer die 306, while the upper surface of the accelerometer die 306 includes lateral interconnections or routing for transmitting gyroscope output signals from the via(s) 316 to the ASIC die 304 via the conductive material 338, with the lower surface of the ASIC die 304 includes lateral interconnections or routing for transmitting the gyroscope output signals to the control circuitry on the ASIC die 304. In this manner, the control circuitry on the ASIC die 304 receives the gyroscope output signals from the gyroscope die 308 and determines the measured orientation of the device package 300. In a similar manner, the control circuitry on the ASIC die 304 transmit or otherwise provide output signals indicative of the measured orientation at one or more package interfaces 311 by transmitting the measured orientation output signals through the underlying dies 306, 308, 310 by way of the vertical through-vias 316, 318, 320 and/or any lateral interconnections provided by the underlying dies 306, 308, 310.

To fabricate the device package 300 of FIG. 3, instances of the ASIC die 304 and the accelerometer die 306 may be fabricated on separate wafers and bonded together in wafer form to establish the desired fixed reference pressure for the chamber 331 associated with the sensing region 330 before dicing or otherwise singulating the ASIC and accelerometer wafers to obtain instances of the stacked ASIC die 304 and accelerometer die 306. Additionally, in some embodiments, instances of the magnetometer die 302 are fabricated, singulated, redistributed to form a reconstructed magnetometer wafer, and bonded to the upper surface of the ASIC wafer (e.g., using an epoxy or another adhesive material), with the wire bonds 303 being provided between instances of the magnetometer die 302 and corresponding instances of the ASIC die 304 before singulating the ASIC and accelerometer wafers. In exemplary embodiments, the conductive bonding structures 307 are formed on the lower surface of the accelerometer wafer before singulation. In alternative embodiments where the magnetometer die 302 is realized as a flip chip, the reconstructed wafer including multiple instances of the magnetometer die 302 may be bonded to the upper surface of the ASIC wafer (e.g., by performing a reflow soldering process) prior to fabricating the conductive bonding structures 307 and prior to singulating the ASIC and accelerometer wafers.

Similarly, instances of the gyroscope die 308 and the capping die 310 are fabricated on separate wafers and bonded together in wafer form to establish the desired fixed reference pressure for the chamber 333 associated with the sensing region 332. Before singulating the gyroscope and capping wafers, a reconstructed wafer including the instances of the stacked ASIC and accelerometer dies 304, 306 is formed and bonded or otherwise joined to the upper surface of the gyroscope wafer using the conductive bonding structures 307, for example, by performing a reflow soldering process. In embodiments where the instances of the magnetometer die 302 are not bonded to the ASIC die 304 before mounting the accelerometer die 306 to the gyroscope die 308, instances of the magnetometer die 302 may be redistributed and bonded to the upper surface of the ASIC dies 304 either concurrently to bonding the accelerometer die 306 (e.g., if the magnetometer die 302 is a flip chip) or after bonding the accelerometer die 306 to the gyroscope die 308. Thereafter, a molding compound 350 is formed overlying the stacked dies 302, 304, 306 and the gyroscope wafer before dicing or otherwise singulating the gyroscope wafer and the capping wafer to obtain multiple instances of the device package 300. In exemplary embodiments, the package interfaces 311 are formed on the lower surface of the capping wafer before singulation, however, in alternative embodiments, the package interfaces 311 may be formed on the lower surface of the capping die 310 after singulation.

Figure 4:
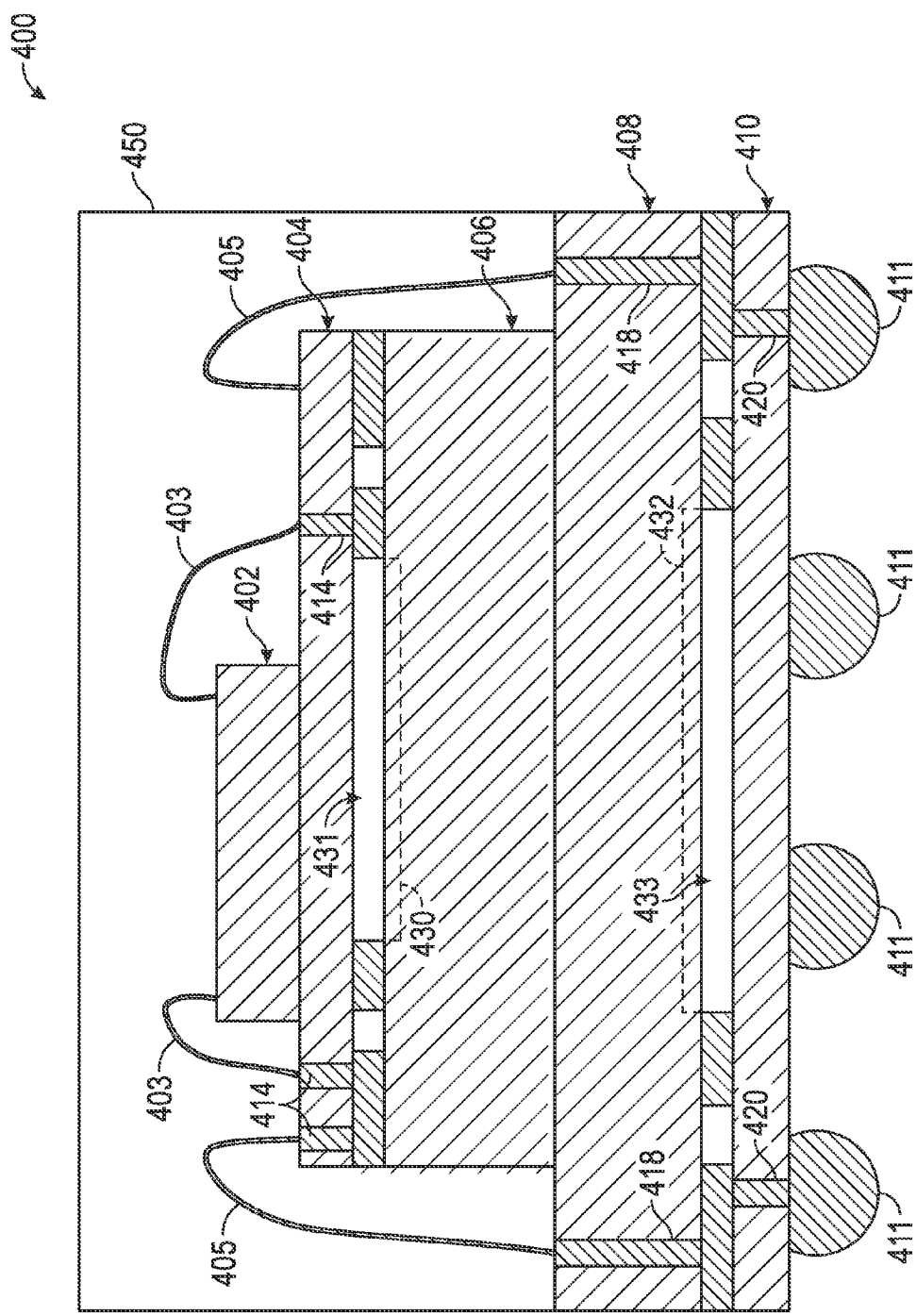

FIG. 4 depicts an alternative embodiment of a stacked multi-sensor semiconductor device package 400 that includes multiple MEMS sensor dies 406, 408. Again, the various elements in the stacked multi-sensor semiconductor device package 400 are similar to those described above in the context of the stacked multi-sensor semiconductor device package 300 of FIG. 3 and the common aspects will not be redundantly described in the context of FIG. 4. In addition, for purposes of explanation, but without limitation, the upper MEMS sensor die 406 may be described as being an accelerometer die, the lower MEMS sensor die 408 may be described as being a gyroscope die, and the upper sensor die 402 may be described as being a magnetometer die. In the embodiment of FIG. 4, the accelerometer sensor die 406 does not include vertical through-vias for providing electrical connections to the control circuitry on the ASIC die 404 vertically through the accelerometer sensor die 406; rather, wire bonds 405 are formed between bonding pads on the upper surface of the ASIC die 404 and corresponding bonding pads on the upper surface of the gyroscope sensor die 408. The gyroscope sensor die 408 and its capping die 410 include vertical through-vias 418, 420 that provide electrical connections between the control circuitry on the ASIC die 404 and the package I/O interfaces 411, and the ASIC die 404 includes vertical through-vias 414 for transmitting signals from/to the magnetometer die 402 and/or the gyroscope die 408 to/from control circuitry formed on or in the lower surface of the ASIC die 404. Additionally, one or more of the vias 414 are utilized for transmitting output signals indicative of measured values determined by the control circuitry from the lower surface of the ASIC die 404 to the package I/O interfaces 411 by way of the wire bonds 405 and vias 418, 420.

To fabricate the device package 400 of FIG. 4, instances of the ASIC die 404 and the accelerometer die 406 are fabricated on separate wafers and bonded together in wafer form to establish the desired fixed reference pressure for the chamber 431 associated with the sensing region 430 before dicing or otherwise singulating the ASIC and accelerometer wafers. Additionally, in some embodiments, instances of the magnetometer die 302 are also bonded to the upper surface of the ASIC wafer before singulating the ASIC and accelerometer wafers. It should be noted that although FIG. 4 depicts wire bonds 403, in alternative embodiments, the magnetometer die 402 may be realized as a flip chip that is soldered or otherwise bonded to the ASIC die 404 as described above in the context of FIG. 1.

As described above in the context of FIG. 3, instances of the gyroscope die 408 and the capping die 410 are also fabricated on separate wafers and bonded together in wafer form to establish the desired fixed reference pressure for the chamber 433 associated with the sensing region 432. Before singulating the gyroscope and capping wafers, the instances of the stacked dies 404, 406 are redistributed to form a reconstructed wafer that is bonded, mounted, affixed, or otherwise joined to the upper surface of the gyroscope wafer (e.g., using an epoxy or another adhesive material). In embodiments where the instances of the magnetometer die 402 are not bonded to the ASIC die 404 before mounting the accelerometer die 406 to the gyroscope wafer, instances of the magnetometer die 402 may be redistributed and bonded to the upper surface of the ASIC dies 404 either concurrently to and/or after bonding the accelerometer die 406 to the gyroscope wafer. Thereafter, the wire bonds 403 are formed or otherwise provided between bonding pads on the magnetometer and ASIC dies 402, 404, wire bonds 405 are formed or otherwise provided between bonding pads on the ASIC and gyroscope dies 404, 408, and a molding compound 450 is formed overlying the stacked dies 402, 404, 406 before singulating the gyroscope wafer and the capping wafer to obtain multiple instances of the device package 400. In exemplary embodiments, the package interfaces 411 are formed on the lower surface of the capping wafer before singulation, however, in alternative embodiments, the package interfaces 411 may be formed on the lower surface of the capping die 410 after singulation.

Figure 5:
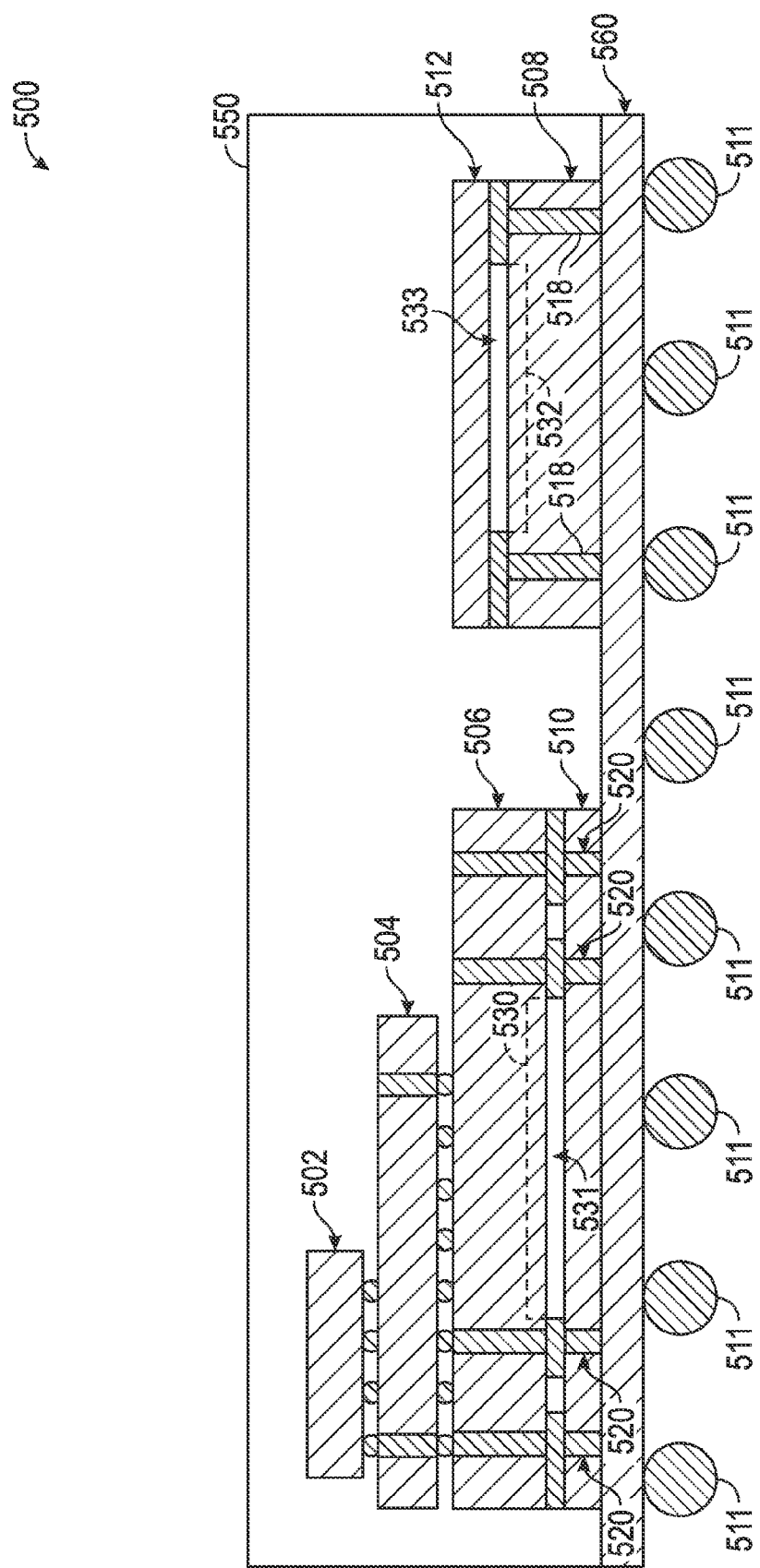
FIG. 5 depicts a cross-sectional view of an exemplary redistributed sensor semiconductor device package in accordance with one or more alternative embodiments of the invention.

FIG. 5 depicts another embodiment of a multi-sensor semiconductor device package 500 that includes multiple MEMS sensor dies 506, 508 that are redistributed on a support structure 560. Again, various elements of the device package 500 are similar to those described above in the context of FIGS. 1-4 and will not be redundantly described in the context of FIG. 5, and for purposes of explanation, MEMS sensor die 406 may be described as being an accelerometer die, MEMS sensor die 508 may be described as being a gyroscope die, and the sensor die 502 may be described as being a magnetometer die. In exemplary embodiments, the support structure 560 is comprised of one or more redistribution (or buildup) metallization layers that provide lateral interconnections between the vias 518 within the gyroscope die 508 and the vias 520 within the accelerometer capping die 510 for transmitting signals between the gyroscope die 508 and the control circuitry on the ASIC die 504 along with vertical and/or lateral interconnections to/from the vias 520 and the package I/O interfaces 511. It should be noted that although FIG. 5 depicts the ASIC die 504 and the magnetometer die 502 as being stacked on the accelerometer die 506, in alternative embodiments, the ASIC die 504 and the magnetometer die 502 may be stacked on the gyroscope die 508. Furthermore, although FIG. 5 depicts the ASIC die 504 and the magnetometer die 502 as flip chips, in alternative embodiments, the ASIC die 504 and/or the magnetometer die 502 may be fabricated in a manner that utilizes wire bonds to provide electrical connections to/from the ASIC die 504 and/or the magnetometer die 502.

To fabricate the device package 500 of FIG. 5, instances of the accelerometer die 506 and the accelerometer capping die 510 are fabricated on separate wafers and bonded together in wafer form to establish the desired fixed reference pressure for the chamber 531 associated with the sensing region 530 before singulating the accelerometer and capping wafers to obtain instances of the stacked accelerometer and capping dies 506, 510. Similarly, instances of the gyroscope die 508 and the gyroscope capping die 512 are fabricated on separate wafers and bonded together in wafer form to establish the desired fixed reference pressure for the chamber 533 associated with the sensing region 532 before singulating the gyroscope and capping wafers to obtain instances of the stacked gyroscope and capping dies 508, 512. Thereafter, instances of the stacked accelerometer and capping dies 506, 510 and instances of the stacked gyroscope and capping dies 508, 512 are redistributed on a carrier substrate before applying a molding compound 550 overlying the dies 506, 508, 510, 512. In this regard, for the illustrated embodiment, the lower surface of the accelerometer capping die 510 opposite the accelerometer die 506 and the lower surface of the gyroscope die 508 opposite the gyroscope capping die 512 are detachably adhered to the carrier substrate. In other embodiments, the opposing surface of the accelerometer die 506 may be adhered to the carrier substrate instead of the accelerometer capping die 510 and/or the opposing surface of the gyroscope capping die 512 may be adhered to the carrier substrate instead of the gyroscope die 508, in which case through-vias may be provided within the gyroscope carrier die 512 instead of the vias 518 within the gyroscope die 508. Prior to forming the molding compound 550, the ASIC die 504 is bonded to the accelerometer die 506 (either before or after singulating the accelerometer die 506), and the magnetometer die 502 is bonded to the ASIC die 504 (either before or after the ASIC die 504 is bonded to the accelerometer die 506).

For the illustrated embodiment, after forming the molding compound 550, the carrier substrate is removed to expose the lower surfaces of the accelerometer capping die 510 and the gyroscope die 508, and the support structure 560 is formed on the lower surfaces of the accelerometer capping die 510 and the gyroscope die 508. In this regard, any number of redistribution metallization layers are fabricated on the lower surface of the reconstructed wafer, for example, by depositing layers of dielectric material and metal material, etching the dielectric layers to form voids, depositing or otherwise forming a conductive material in the voids to provide the desired vertical interconnections through the dielectric layers, and etching or otherwise patterning the metal layers to provide the desired lateral interconnections among the vias in the dielectric layers. Thereafter, the package interfaces 311 may be formed by forming conductive bonding structures on or otherwise in contact with exposed pad portions of the lowest (or outermost) metal layer of the support structure 560. Thereafter, the reconstructed wafer is diced or otherwise singulated to obtain multiple instances of the device package 500.

One benefit of the device package 500 of FIG. 5 is that a nine degrees of freedom sensor device package may be achieved that has a reduced profile (or height) relative to the multi-sensor device packages 100, 300, 400 of FIGS. 1, 3 and 4. At the same time, a relatively small footprint may be maintained for the device package 500 by stacking the magnetometer die 502 and the ASIC die 504 on the accelerometer die 506. To further reduce the profile (or height) of the package 500, in alternative embodiments, the ASIC die 504 may be bonded to the accelerometer die 506 or the gyroscope die 508 in lieu of the respective capping die 510, 512 as described above in the context of FIGS. 3-4 to provide a sealed chamber between the ASIC die 504 and the respective sensor die 506, 508 and remove the respective capping die 510, 512 from the device package 500. In yet other embodiments, the magnetometer die 502 may be provided on the support structure 560 adjacent one or more of the sensor dies 506, 508 and arranged with respect to the sensor dies 506, 508 in a manner that does not appreciably increase the footprint of the device package 500, thereby further reducing the profile (or height) of the package 500.

For the sake of brevity, conventional techniques related to semiconductor and/or integrated circuit fabrication, redistributed chip packaging (RCP), wire bonding, overmolding, flip chips, TSVs, and other functional aspects of the subject matter may not be described in detail herein. In addition, certain terminology may be used herein for the purpose of reference only, and thus are not intended to be limiting. For example, the terms "first," "second," and other such numerical terms referring to structures do not imply a sequence or order unless clearly indicated by the context, and terms such as "upper," "lower," "top," "bottom," and the like refer to directions in the drawings to which reference is made. The foregoing description also refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although a schematic shown in the figures may depict direct electrical connections between circuit elements and/or terminals, alternative embodiments may employ intervening circuit elements and/or components while functioning in a substantially similar manner.

In conclusion, systems, devices, and methods configured in accordance with example embodiments of the invention relate to:

An apparatus for a sensor device is provided in one exemplary embodiment. The semiconductor device package comprises a first structure having a sensing arrangement thereon, a second structure having circuitry thereon, and a conductive structure within the first structure and coupled to the circuitry to provide an electrical connection to the circuitry through the first structure. In one embodiment, the circuitry comprises control circuitry coupled to the sensing arrangement to determine a metric indicative of a sensed characteristic based on an electrical signal from the sensing arrangement. In another embodiment, the sensor device further comprises an interface coupled to the conductive structure, wherein the conductive structure provides the electrical connection between the interface and the circuitry through the first structure. In further embodiments, the first structure comprises a first semiconductor substrate having the sensing arrangement fabricated thereon, the second structure comprises a second semiconductor substrate having the circuitry fabricated thereon, the conductive structure provides the electrical connection between the sensing arrangement and the circuitry, and the circuitry comprises an application specific integrated circuit to determine a metric indicative of a sensed characteristic based on an electrical signal from the sensing arrangement received via the conductive structure.

In yet another embodiment, the sensor device further comprises a third structure coupled to a first side of the first structure to establish a fixed reference pressure on the first side of the sensing arrangement and a second conductive structure within the third structure and coupled to the conductive structure to provide the electrical connection to the circuitry through the third structure, with the second structure being coupled to a second side of the first structure opposite the first side. In some embodiments, the sensor device further comprises a fourth structure coupled to the third structure to establish a second fixed reference pressure on the first side of a second sensing arrangement on the first structure and a third conductive structure within the fourth structure and coupled to the second conductive structure to provide the electrical connection to the circuitry through the fourth structure. In another embodiment, the second structure is coupled to the first structure to establish a fixed reference pressure for the sensing arrangement. In yet another embodiment, the sensor device further comprises a third structure having a second sensing arrangement thereon, a second conductive structure within the third structure and coupled to the second sensing arrangement to provide a second electrical connection to the second sensing arrangement through the third structure, and a support structure to provide a lateral electrical connection between the second conductive structure and the conductive structure, wherein the support structure may comprise one or more redistribution layers.

In one or more embodiments, the sensor device further comprises a second conductive structure within the second structure and coupled to the circuitry to provide a second electrical connection to the circuitry through the second structure and a third structure having a second sensing arrangement thereon, wherein the second conductive structure provides the second electrical connection between the second sensing arrangement and the circuitry, the third structure overlies the second structure, the second structure overlies the first structure, and a molding compound overlies the first structure, the molding compound encapsulating the second structure and the third structure.

An apparatus for a sensor device package is provided in another embodiment. The sensor device package comprises a package interface, a first sensor die overlying the package interface, the first sensor die having a first sensing arrangement thereon, a first conductive structure within the first sensor die, the first conductive structure extending through the first sensor die and being coupled to the package interface to provide an electrical connection through the first sensor die to the package interface, and a second die overlying the first sensor die, the second die having circuitry thereon, the circuitry being coupled to the first sensing arrangement to determine a metric indicative of a sensed characteristic based on one or more signals from the first sensing arrangement, wherein the circuitry is coupled to the first conductive structure to provide one or more output signals indicative of the metric to the package interface via the electrical connection. In one embodiment, the sensor device package further comprises a second package interface, a second sensor die overlying the second die, the second sensor die having a second sensing arrangement thereon, wherein the circuitry is coupled to the second sensing arrangement to determine a second metric indicative of a second sensed characteristic based on signals from the second sensing arrangement, and a second conductive structure within the first sensor die, the second conductive structure extending through the first sensor die and being coupled to the second package interface to provide a second electrical connection through the first sensor die to the second package interface, wherein the circuitry is coupled to the second conductive structure to provide one or more output signals indicative of the second metric to the second package interface via the second electrical connection. In another embodiment, the sensor device package further comprises a second sensor die, wherein the first sensor die overlies the second sensor die and the second sensor die has a second sensing arrangement thereon, and a second conductive structure within the first sensor die, the second conductive structure extending through the first sensor die, the second conductive structure being coupled to the circuitry and the second sensing arrangement to provide a second electrical connection through the first sensor die between the circuitry and the second sensing arrangement, wherein the circuitry is configured to determine a second metric indicative of a second sensed characteristic based on electrical signals from the second sensing arrangement received via the second electrical connection.

In another exemplary embodiment, a method of fabricating a sensor device is provided. The method comprises forming a conductive structure within a first semiconductor substrate and extending through the first semiconductor substrate, the first semiconductor substrate having a first sensing arrangement fabricated thereon, providing a first electrical connection between the conductive structure and an interface of the sensor device, and providing a second electrical connection between the conductive structure and circuitry fabricated on a second semiconductor substrate, resulting in an electrical connection between the circuitry and the interface through the first semiconductor substrate. In one embodiment, the method further comprises forming a second conductive structure within the second semiconductor substrate and extending through the second semiconductor substrate, the second conductive structure being coupled to the circuitry, wherein providing the second electrical connection comprises providing the second electrical connection between the conductive structure and the second conductive structure. In another embodiment, the method further comprises bonding a third semiconductor substrate to the first semiconductor substrate to establish a reference pressure for the first sensing arrangement between the third semiconductor substrate and the first semiconductor substrate, wherein providing the first electrical connection comprises forming a second conductive structure within the third semiconductor substrate and extending through the third semiconductor substrate, the second conductive structure being coupled to the interface and the conductive structure.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A sensor device comprising:
   a first semiconductor die having a sensing arrangement fabricated thereon;
   a second semiconductor die having circuitry fabricated thereon;
   a conductive structure within the first semiconductor die and coupled to the circuitry to provide a first electrical connection between the sensing arrangement and the circuitry through the first semiconductor die;
   a third structure coupled to a first side of the first semiconductor die to establish a sealed chamber having a fixed reference pressure on the first side of the sensing arrangement, the second semiconductor die being coupled to a second side of the first semiconductor die opposite the first side; and
   a second conductive structure within the third structure and coupled to the conductive structure to provide a second electrical connection to the circuitry through the third structure.

2. The sensor device of claim 1, wherein the circuitry comprises control circuitry coupled to the sensing arrangement to determine a metric indicative of a sensed characteristic based on an electrical signal from the sensing arrangement.

3. The sensor device of claim 1, further comprising an interface coupled to the conductive structure, wherein the conductive structure provides the first electrical connection between the interface and the circuitry through the first semiconductor die.

4. The sensor device of claim 1, wherein:
   the circuitry comprises an application specific integrated circuit to determine a metric indicative of a sensed characteristic based on an electrical signal from the sensing arrangement received via the conductive structure.

5. The sensor device of claim 1, further comprising:
   a fourth structure coupled to the third structure to establish a second fixed reference pressure on the first side of a second sensing arrangement on the first semiconductor die; and
   a third conductive structure within the fourth structure and coupled to the second conductive structure to provide the second electrical connection to the circuitry through the fourth structure.

6. The sensor device of claim 1, wherein the second semiconductor die is coupled to the first semiconductor die to establish a second fixed reference pressure for the sensing arrangement.

7. The sensor device of claim 1, further comprising:
   a fourth structure having a second sensing arrangement thereon;
   a third conductive structure within the fourth structure and coupled to the second sensing arrangement to provide a third electrical connection to the second sensing arrangement through the fourth structure; and
   a support structure to provide a lateral electrical connection between the third conductive structure and the conductive structure.

8. The sensor device of claim 7, wherein the support structure comprises one or more redistribution layers.

9. The sensor device of claim 1, further comprising a third conductive structure within the second semiconductor die and coupled to the circuitry to provide the second electrical connection to the circuitry through the second semiconductor die.

10. The sensor device of claim 9, further comprising a fourth structure having a second sensing arrangement thereon, wherein the second conductive structure provides the second electrical connection between the second sensing arrangement and the circuitry.

11. The sensor device of claim 10, wherein:
   the fourth structure overlies the second semiconductor die;
   the second semiconductor die overlies the first semiconductor die; and
   a molding compound overlies the first semiconductor die, the molding compound encapsulating the second semiconductor die and the fourth structure.

12. A sensor device package comprising:
   a package interface;
   a first sensor die overlying the package interface, the first sensor die having a first sensing arrangement thereon;
   a first conductive structure within the first sensor die, the first conductive structure extending through the first sensor die and being coupled to the package interface to provide a first electrical connection through the first sensor die to the package interface;

a second die overlying the first sensor die, the second die having circuitry thereon, the circuitry being coupled to the first sensing arrangement to determine a metric indicative of a sensed characteristic based on one or more signals from the first sensing arrangement, wherein the circuitry is coupled to the first conductive structure to provide one or more output signals indicative of the metric to the package interface via the first electrical connection;

a third structure coupled to a first side of the first sensor die to establish a fixed reference pressure on the first side of the first sensing arrangement, the second die being coupled to a second side of the first sensor die opposite the first side; and a second conductive structure within the third structure and coupled to the first conductive structure to provide a second electrical connection to the circuitry through the third structure.

13. The sensor device package of claim 12, further comprising:
a second package interface;
a second sensor die overlying the second die, the second sensor die having a second sensing arrangement thereon, wherein the circuitry is coupled to the second sensing arrangement to determine a second metric indicative of a second sensed characteristic based on signals from the second sensing arrangement; and
a third conductive structure within the first sensor die, the third conductive structure extending through the first sensor die and being coupled to the second package interface to provide a third electrical connection through the first sensor die to the second package interface, wherein the circuitry is coupled to the third conductive structure to provide one or more output signals indicative of the second metric to the second package interface via the third electrical connection.

14. The sensor device package of claim 12, further comprising:
a second sensor die, the first sensor die overlying the second sensor die, the second sensor die having a second sensing arrangement thereon; and
a third conductive structure within the first sensor die, the third conductive structure extending through the first sensor die, the third conductive structure being coupled to the circuitry and the second sensing arrangement to provide a third electrical connection through the first sensor die between the circuitry and the second sensing arrangement, wherein the circuitry is configured to determine a second metric indicative of a second sensed characteristic based on electrical signals from the second sensing arrangement received via the third electrical connection.

15. A method of fabricating a sensor device, the method comprising:
forming a conductive structure within a first semiconductor die and extending through the first semiconductor die, the first semiconductor die having a first sensing arrangement fabricated thereon;
bonding a third semiconductor die to the first semiconductor die to establish a sealed chamber having a reference pressure for the first sensing arrangement between the third semiconductor die and the first semiconductor die;
providing a first electrical connection between the conductive structure and an interface of the sensor device, wherein providing the first electrical connection comprises forming a second conductive structure within the third semiconductor die and extending through the third semiconductor die, the second conductive structure being coupled to the interface and the conductive structure;
providing a second electrical connection between the conductive structure and circuitry fabricated on a second semiconductor die, resulting in an electrical connection between the circuitry and the interface through the first semiconductor die.

16. The method of claim 15, further comprising forming a second conductive structure within the second semiconductor die and extending through the second semiconductor die, the second conductive structure being coupled to the circuitry, wherein providing the second electrical connection comprises providing the second electrical connection between the conductive structure and the second conductive structure.

17. The sensor device of claim 1, wherein the second semiconductor die overlies the first semiconductor die.

18. The sensor device of claim 1, wherein:
the first semiconductor die overlies the third structure; and
the second semiconductor die overlies the first semiconductor die.

* * * * *